(12) United States Patent
Tucker et al.

(10) Patent No.: US 10,496,787 B2
(45) Date of Patent: Dec. 3, 2019

(54) SYSTEM AND METHOD OF ROTORCRAFT USAGE MONITORING

(71) Applicant: Bell Helicopter Textron Inc., Fort Worth, TX (US)

(72) Inventors: Brian Tucker, Fort Worth, TX (US); Tom Wood, Pantego, TX (US); Robert Wardlaw, Keller, TX (US); Bang Nguyen, Watauga, TX (US); Allen Altman, Keller, TX (US)

(73) Assignee: Bell Helicopter Textron Inc., Fort Worth, TX (US)

( * ) Notice: Subject to any disclaimer, the term of this patent is extended or adjusted under 35 U.S.C. 154(b) by 283 days.

(21) Appl. No.: 14/322,312

(22) Filed: Jul. 2, 2014

(65) Prior Publication Data

US 2015/0007666 A1 Jan. 8, 2015

Related U.S. Application Data

(60) Provisional application No. 61/841,991, filed on Jul. 2, 2013.

(51) Int. Cl.
*B64F 5/60* (2017.01)
*G01L 5/00* (2006.01)
*G07C 5/08* (2006.01)
*G05B 23/02* (2006.01)
(Continued)

(52) U.S. Cl.
CPC ............ *G06F 17/5095* (2013.01); *B64F 5/60* (2017.01); *G01L 5/00* (2013.01); *G05B 23/0283* (2013.01); *G05B 19/4065* (2013.01); *G05B 23/024* (2013.01); *G05B 23/0254* (2013.01); *G05B 23/0281* (2013.01); *G05B 2219/34477* (2013.01); *G05B 2219/37253* (2013.01); *G07C 5/085* (2013.01)

(58) Field of Classification Search
CPC ...... G05B 19/4065; G05B 2219/34477; G05B 2219/37253; G05B 23/024; G05B 23/0254; G05B 23/0281; G05B 23/0283
USPC ........ 701/14, 29.3, 3, 31.4, 31.9, 33.4, 33.9; 702/187, 189, 190, 34, 41
See application file for complete search history.

(56) References Cited

U.S. PATENT DOCUMENTS

| 4,733,361 A | 3/1988 | Krieser et al. |
| 5,929,431 A | 7/1999 | Hadley |
| 6,322,324 B1 | 11/2001 | Kennedy et al. |

(Continued)

FOREIGN PATENT DOCUMENTS

| EP | 0407179 A1 | 1/1991 |
| EP | 1240080 B1 | 12/2004 |

OTHER PUBLICATIONS

Partial European Search Report in related European Application No. 14175445.7, dated Nov. 5, 2014, 7 pages.
(Continued)

*Primary Examiner* — Jonathan M Dunlap
(74) *Attorney, Agent, or Firm* — Lightfoot & Alford PLLC (57) ABSTRACT

A method of monitoring usage of a component of an aircraft can include: monitoring a usage of the component by using a torque measurement system to calculate torque events in a time period; categorizing the usage of the component by assigning a usage value based upon whether the number of torque events in the period of time is above or below a threshold; and determining a life used of the component.

19 Claims, 12 Drawing Sheets

(51) Int. Cl.
*G06F 17/50* (2006.01)
*G05B 19/4065* (2006.01)

(56) References Cited

U.S. PATENT DOCUMENTS

| | | | |
|---|---|---|---|
| 6,351,713 B1 | 2/2002 | Board et al. | |
| 6,453,669 B2 | 9/2002 | Kennedy et al. | |
| 6,768,938 B2 | 7/2004 | McBrien et al. | |
| 6,898,584 B1 | 5/2005 | McCool et al. | |
| 7,013,210 B2 | 3/2006 | McBrien et al. | |
| 7,027,953 B2 | 4/2006 | Klein | |
| 7,143,007 B2 | 11/2006 | Long et al. | |
| 7,225,062 B2 | 5/2007 | Aubourg | |
| 7,454,297 B2* | 11/2008 | Balestra | G07C 5/0841 702/34 |
| 7,684,936 B2 | 3/2010 | Bechhoefer | |
| 7,719,416 B2 | 5/2010 | Arms et al. | |
| 7,844,404 B2 | 11/2010 | Ling et al. | |
| 7,983,809 B2 | 7/2011 | Kell et al. | |
| 7,984,146 B2 | 7/2011 | Rozak et al. | |
| 8,068,997 B2 | 11/2011 | Ling et al. | |
| 8,079,274 B2 | 12/2011 | Mian et al. | |
| 8,131,420 B2 | 3/2012 | Lynch et al. | |
| 8,132,474 B2 | 3/2012 | Jackson | |
| 8,200,442 B2* | 6/2012 | Adams | G06Q 10/04 702/34 |
| 8,571,814 B2* | 10/2013 | Zhao | G06Q 10/04 702/34 |
| 9,090,339 B2* | 7/2015 | Arms | B64C 27/006 |
| 9,120,581 B2* | 9/2015 | Costes | B64C 13/503 |
| 2002/0018716 A1 | 2/2002 | Kennedy et al. | |
| 2002/0165647 A1 | 11/2002 | Glenn, III et al. | |
| 2004/0176902 A1 | 9/2004 | McBrien et al. | |
| 2004/0193386 A1 | 9/2004 | Flynn et al. | |
| 2005/0096873 A1 | 5/2005 | Klein | |
| 2006/0064210 A1 | 3/2006 | Aubourg | |
| 2006/0235707 A1 | 10/2006 | Goldstein et al. | |
| 2007/0260726 A1 | 11/2007 | Rozak et al. | |
| 2008/0036617 A1 | 2/2008 | Arms et al. | |
| 2008/0041141 A1 | 2/2008 | Discenzo | |
| 2008/0247448 A1* | 10/2008 | Balestra | G01D 1/12 375/224 |
| 2008/0272915 A1 | 11/2008 | Day | |
| 2009/0083050 A1 | 8/2009 | Eltman et al. | |
| 2009/0211381 A1 | 8/2009 | Zakrzewski et al. | |
| 2009/0216398 A1 | 8/2009 | Lynch et al. | |
| 2009/0281735 A1 | 11/2009 | Bechhoefer | |
| 2009/0300379 A1 | 12/2009 | Mian et al. | |
| 2010/0031756 A1 | 2/2010 | Mian et al. | |
| 2010/0042283 A1 | 2/2010 | Kell et al. | |
| 2010/0057277 A1 | 3/2010 | Goodrich et al. | |
| 2010/0100337 A1* | 4/2010 | Vichare | G06F 11/008 702/34 |
| 2010/0153025 A1 | 6/2010 | Ling et al. | |
| 2010/0161244 A1 | 6/2010 | Ghoshal et al. | |
| 2010/0204931 A1 | 8/2010 | Ling et al. | |
| 2010/0219987 A1 | 9/2010 | Isom et al. | |
| 2010/0235108 A1 | 9/2010 | Adams et al. | |
| 2010/0235109 A1 | 9/2010 | Zhao et al. | |
| 2011/0040719 A1 | 2/2011 | Aguilar et al. | |
| 2011/0046996 A1 | 2/2011 | Foucher et al. | |
| 2011/0057071 A1 | 3/2011 | Sahasrabudhe et al. | |
| 2011/0245999 A1 | 10/2011 | Kordonowy | |
| 2011/0264310 A1 | 10/2011 | Bates et al. | |
| 2011/0285527 A1 | 11/2011 | Arms et al. | |
| 2011/0288790 A1* | 11/2011 | Dong | G06F 17/5009 702/34 |
| 2012/0035864 A1* | 2/2012 | Frydendal | G05B 23/0221 702/41 |
| 2012/0067671 A1 | 3/2012 | Sammataro et al. | |
| 2012/0072130 A1* | 3/2012 | Doleschel | G01L 3/109 702/41 |
| 2012/0078544 A1 | 3/2012 | Lynch et al. | |
| 2012/0130650 A9* | 5/2012 | Dong | G06F 17/5009 702/34 |
| 2012/0239244 A1* | 9/2012 | Costes | B64C 13/503 701/31.9 |
| 2013/0184959 A1 | 7/2013 | Wendelsdorf et al. | |
| 2013/0289804 A1 | 10/2013 | Covington et al. | |
| 2014/0324377 A1* | 10/2014 | Fenn | G01M 17/00 702/113 |

OTHER PUBLICATIONS

European Search Report in related European Application No. 14175445.7, dated Feb. 23, 2015, 5 pages.
European Office Action in related European Application No. 14175445.7, dated Mar. 23, 2015, 5 pages.
European 3rd Party Observations in related European Application No. 14175445.7, dated Feb. 25, 2015, 12 pages.
Dempsey et al., Gear Damage Detection Using Oil Debris Analysis, Technical Report, Sep. 1, 2001, 17 pages.
Dempsey et al, Integrating Oil Debris and Vibration Measurements for Intelligent Machine Health Monitoring, PhD Dissertation May 1, 2003, 114 pages.
Zakrajsek et al., Rotorcraft Health Management Issues and Challenges, Technical Report, Feb. 1, 2006, 21 pages.
Dickson et al., Feasibility Study of Rotorcraft Health and Usage Monitoring System (HUMS): Results of Operator's Evaluation, Technical Report, Feb. 1, 1996, 57 pages.
Dempsey et al., Investigation of Current Methods to Identify Helicopter Gear Health, Conference Paper, Jan. 1, 2007, 15 pages.
Dempsey et al., Signal Detection Theory Applied to Helicopter Transmission Diagnosis Thresholds, Technical Report, Jul. 1, 2008, 24 pages.
Augustin, Hazard Assessment for Usage Credits on Helicopters Using Health and Usage Monitoring System, Technical Report, Jul. 2004, 65 pages.
Vergroesen et al., An Automatic In-flight Data Acquisition System for the FNLN Lynx Helicopter, Presentation Report, Feb. 1998, 15 pages.
European 3rd Party Observations (Communication pursuant to Rule 114(2) EPC) in related European Application No. 14175445.7, dated Feb. 25, 2015, 12 pages.
European Office Action in related European Patent Application No. 14175445.7, dated Oct. 12, 2015, 6 pages.
Notice of Allowance in related European Patent Application No. 14175445.7, dated Nov. 7, 2016, 43 pages.
"Rainflow-counting algorithm", https://en.wikipedia.org/wiki/Rainflow-counting_algorithm, last updated Aug. 5, 2016, 3 pages.
Anonymous, "Lineare Schadensakkumulation", Wikipedia, dated Jan. 26, 2005, 1 page.
Anonymous, "Lineare Schadensakkumulation", Wikipedia, dated Oct. 7, 2014, 3 pages.

* cited by examiner

|  | AT INSTALLATION: | AT REMOVAL: | ACCUMULATED HOURS: | EQUIVALENT LIFE USED: |
|---|---|---|---|---|
| TOTAL HOURS | A | B | C = B-A | (FROM LOOK-UP TABLE OR CALCULATION*) |
| LONG HAUL HOURS | D | E | F = E-D |  |

*CALCULATION = F + (C-F) *LIFE FACTOR (FOR THE SPECIFIC COMPONENT) — 1303

FIG. 13

AIRCRAFT: 1234
AIR TIME: 2250.0
SHORT HAUL TIME: 300.0
LONG HAUL TIME: 1900.0

1401

AIRCRAFT: 1234
AIR TIME: 3950.0
SHORT HAUL TIME: 1000.0
LONG HAUL TIME: 2850.0

| COMPONENT ABC SERIAL No. A-0001 | AT INSTALLATION: | AT REMOVAL: | ACCUMULATED HOURS: | EQUIVALENT LIFE USED: |
|---|---|---|---|---|
| TOTAL AIRCRAFT HOURS | 2250.0 | 3950.0 | 1700.0 | 2450 |
| LONG HAUL HOURS | 1900.0 | 2850.0 | 950.0 |  |

SYSTEM AND METHOD OF ROTORCRAFT USAGE MONITORING

BACKGROUND

Technical Field

The present disclosure relates to a system and method of rotorcraft usage monitoring. More specifically, the present disclosure relates to a system and method of analyzing torque measurements and applying usage credits and/or debits to rotorcraft components.

Description of Related Art

Conventionally, aircraft have been designed to an assumed usage that is generally designed to cover the most severe usage expected by an operator. This assumed usage is used to determine the retirement lives and/or inspection intervals of structural components (rotor, driveshafts, pylon, airframe, etc.). This conventional approach leads to an aircraft which is sub-optimal (heavier than necessary) for most operators' usage. Additionally, assigning time conservatively to one system may result in assigning non-conservative time to another system (rotor components may damage more in level flight vs. mast may damage more in low cycle torque events for example). Moreover, the aircraft usage may change over time due to market demand and operator preference which can lead to early retirements, un-necessary short inspection on some components, and margin reduction on other components.

There is a need for a system and method of rotorcraft usage monitoring.

DESCRIPTION OF THE DRAWINGS

The novel features believed characteristic of the system and method of the present disclosure are set forth in the appended claims. However, the system and method itself, as well as a preferred mode of use, and further objectives and advantages thereof, will best be understood by reference to the following detailed description when read in conjunction with the accompanying drawings, wherein:

DESCRIPTION OF THE PREFERRED EMBODIMENT

Illustrative embodiments of the system and method of the present disclosure are described below. In the interest of clarity, all features of an actual implementation may not be described in this specification. It will of course be appreciated that in the development of any such actual embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure, In the specification, reference may be made to the spatial relationships between various components and to the spatial orientation of various aspects of components as the devices are depicted in the attached drawings. However, as will be recognized by those skilled in the art after a complete reading of the present disclosure, the devices, members, apparatuses, etc. described herein may be positioned in any desired orientation. Thus, the use of terms such as "above," "below," "upper," "lower," or other like terms to describe a spatial relationship between various components or to describe the spatial orientation of aspects of such components should be understood to describe a relative relationship between the components or a spatial orientation of aspects of such components, respectively, as the device described herein may be oriented in any desired direction.

Conventionally, aircraft have been designed to an assumed usage that is generally designed to cover the most severe usage expected in service to maintain safety for all operators. This assumed usage is used to determine the retirement lives and/or inspection intervals of structural components (rotor, driveshafts, pylon, airframe, etc.). This conventional approach leads to an aircraft which is sub-optimal (heavier than necessary) for most operators' usage. Additionally, making usage assumptions that produce conservative damage to one system may result in assigning non-conservative damage to another system (rotor components may incur more damage in level flight vs. mast may incur more damage in low cycle torque events for example). Moreover, the aircraft usage may change over time due to market demand and operator preference, which can lead to early retirements/un-necessary short inspection on some components and reduce margin on other components.

One strategy for dealing with this problem can include introducing a manual cycle counting approach. In one approach, the components have a cycle-based life in additional to a time-based life. Such a method relies on the pilot's ability to manually count events (in addition to existing workload) and the manual events must always be assumed to be of the worst severity since no measurements are made.

Another strategy for dealing with the problem can include introducing "penalties" which are also manually based. In this approach, a manual accounting for either events (e.g., external load lifts) or types of operation (e.g., gross weight greater than 6500 kg) is associated with a penalty, typically in the form of a life multiplier or extra time addition (e.g., every hour of a certain type of operation counts as 3 hours and every occurrence of this type of operation incurs a fixed penalty of 4.5 hours). This method removes the need to count two types of usage as in the previous example, but the penalties can often be confusing especially when more than one penalty may apply for a given operation. For example, the operator may not know whether the life multipliers are multiplied themselves, and/or whether the fixed penalties are multiplied by the life multiplier. Additionally, this approach has the same drawback as the previous method in that the severity of the usage can't be measured, so the penalty is normally very conservative.

The system and method of the present disclosure can use a torque measurement system to count aircraft low cycle usage events. The aircraft and aircraft components are designed to usage assumptions that are more optimal for normal usage. The usage debit system measures usage and penalizes average usage above the threshold used in design. Additionally, the low cycle event count can be used to determine a more accurate usage spectrum for aircraft. This system and method of determining aircraft usage is applied in a more consistent manner, and provides more timely feedback to the operator as to how the aircraft can be used optimally. If the operator does not use the aircraft the way it is designed, consequences are shown in the retirement lives and/or inspection intervals. The operator can consequently have the information necessary to operate the aircraft more economically. Further, information regarding usage can be communicated to the pilot. For example, a display in the cockpit can communicate usage data to the pilot. One example of a communication system is described in patent application Ser. No. 13/868,159 to Covington et al., having a publication number of US 2013/0289804 A1, and a filing date of Oct. 31, 2013, which is hereby incorporated by reference.

The system and method can monitor rotor torque excursions over time and assign that time into categories of usage. Penalization (debit) can be applied for usage time in the categories of usage that are more severe than the predetermined usage threshold used in the initial design of the component. The system and method are configured to automatically account for severe usage which allows the aircraft structure to be designed to a more nominal fatigue design point rather than for the worst case usage.

Helicopter usage assumptions dictate the aircraft's design stress allowables and therefore the aircraft weight. Usage can be high cycle (smaller occurrences nearly every rotor revolution) or low cycle (larger occurrences due to less frequent events). The predominant form of a low cycle event is ground-air-ground; however, other events, such as external load lifts, can also be recorded as a low cycle event. One important feature of the system and method is the recognition that the aforementioned rotor torque excursions correlate with these low cycle events/usage. The system and method of the present disclosure are configured for monitoring the low cycle usage, then applying operating cost debits (penalties) and credits (awards) to the aircraft components for time the aircraft operates more or less severely than the established threshold usage applied during the aircraft design.

The system and method of the present disclosure have distinct advantages over conventional practices, such as 1) simplified tracking of usage; 2) ability to measure severity of the torque excursion, thus the low cycle event, and therefore penalize less severe cycles at a lower rate than more severe cycles; 3) ability to average out usage over a period of time so that short periods of time with usage above the design usage threshold may be averaged out with longer periods of time with design below the threshold and therefore not be penalized; 4) ability to also adjust high cycle usage spectrum—knowing the number of low cycle events in a period of time also indicates differences in overall aircraft usage (e.g., what percent time is spent in level flight or any other maneuver); and 5) ability to inform operators of aircraft that were not used optimally, so that operators can change their usage to keep the aircraft operated economically.

Further regarding the fourth advantage above, a higher number of low cycle events per hour indicates more stopping/slowing versus a lower number of low cycle events per hour. High cycle usage can be categorically differentiated on this basis as "long haul" or "short haul" mission types (similar to "highway" and "city" driving in a car).

Figure 1:
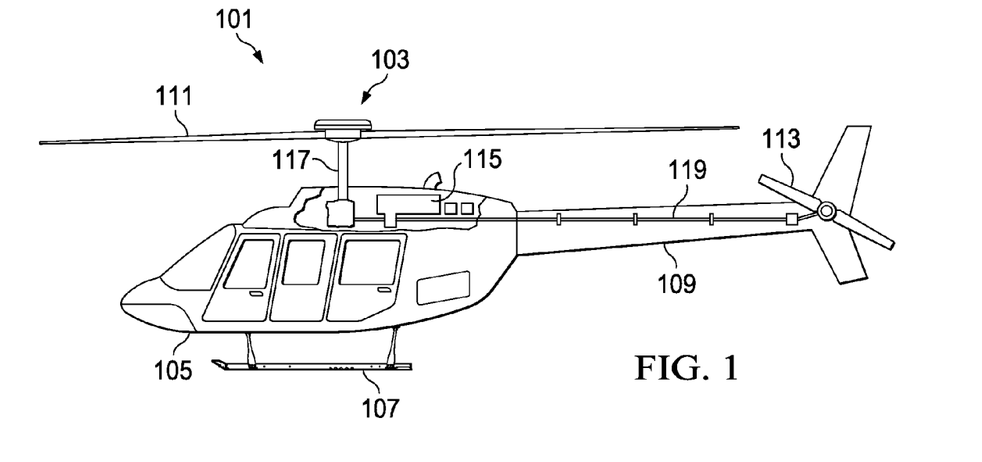
FIG. 1 is a side view of an rotorcraft, according to one example embodiment.

Referring to FIG. 1 in the drawings, an exemplary rotorcraft 101 is illustrated. Rotorcraft 101 has a rotor system 103 with a plurality of main rotor blades 111. Rotorcraft 101 further includes a fuselage 105, landing gear 107, a tail member 109, and tail rotor blades 113. An engine 115 supplies torque to a main rotor mast 117 and a tail rotor drive shaft 119, for the rotation of main rotor blades 111 and tail rotor blades 113, respectively. The pitch of each main rotor blade 111 can be selectively controlled in order to selectively control direction, thrust, and lift of rotorcraft 101. Further, the pitch of tail rotor blades 113 can be selectively controlled in order to selectively control yaw of rotorcraft 101.

Rotorcraft 101 is merely illustrative of the wide variety of aircraft that are particularly well suited to take advantage of the method and system of the present disclosure. It should be appreciated that other aircraft can also utilize the method and system of the present disclosure.

Figure 2:
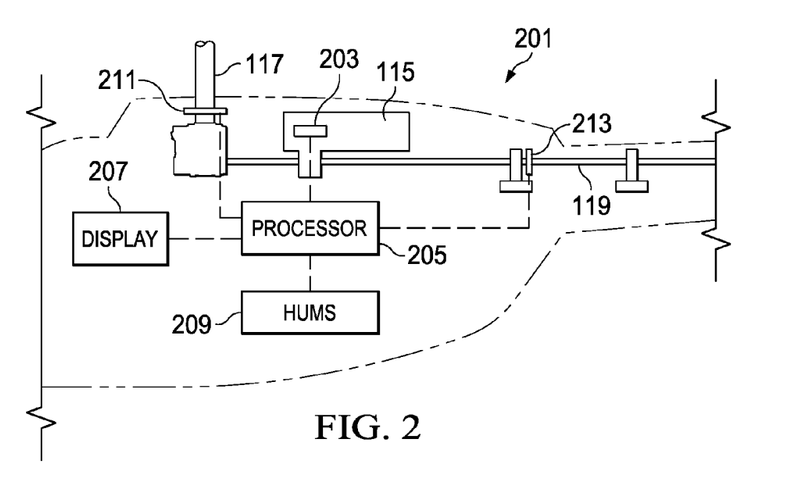
FIG. 2 is a partially schematic view of rotorcraft systems, according to one example embodiment.

Referring now also to FIG. 2, a torque measuring system 201 is schematically illustrated. Torque measuring system 201 is configured to ascertain a torque in one or more drivetrain components. In one embodiment, torque measuring system 201 ascertains the torque in main rotor mast 117. In one embodiment, the torque in main rotor mast 117 can be measured directly with a torque sensor 211. In another embodiment, the torque in main rotor mast 117 is analytically derived. It should be appreciated that torque sensor 211 can be any variety of torque sensors known in the art, such as a Hall Effect sensor, a strain gauge, an optical sensor, or a variable reluctance sensor system comprising a combination of magnetic members and coil members, to name a few examples. One example of a main rotor mast torque sensor is a Hall Effect sensor which is disclosed in U.S. Pat. No. 8,132,474 to Jackson, entitled "Hall Effect Helicopter Mast Torque Meter", having an issue date of Mar. 13, 2012, which is hereby incorporated by reference.

In another embodiment, torque measuring system 201 includes a torque sensor 213 configured for measuring a torque in tail rotor drive shaft 119. Further, torque measuring system 201 can include a total engine torque output sensor 203 in communication with a processor 205. Processor 205 is configured to analyze data from total engine torque output sensor 203 and torque sensor 213 to derive the torque in main rotor mast 117. In one embodiment, processor 205 uses the tail rotor drive shaft torque measurement obtained by torque sensor 213 and the total output torque measured by output sensor 203 to derive the torque in main rotor mast 117 by using conservation of energy/power principles. Processor 205 can be configured to consider any power consumed by an auxiliary gearbox, or other power consuming system, when employing conservation of energy/power principles to derive the torque in main rotor mast 117. Further, processor 205 can be configured to consider other mechanical losses that may be necessary to derive an accurate torque value in main rotor mast 117. It should be appreciated that total engine torque output sensor 203 can be the sum of torque from a plurality of engines. Such a torque measurement system is described in patent application Ser. No. 13/722,005 to Wendelsdorf et al., having a publication number of US 2013/0184959 A1, and a filing date of Dec. 20, 2012, which is hereby incorporated by reference.

A health and usage monitoring system ("HUMS") 209 can include functionality for evaluating and providing useful usage data pertaining to torque in main rotor mast 117 to an operator of rotorcraft 101. HUMS 209 can be configured to store and communicate a torque history which can be used to credit and/or debit usage life of aircraft components. Further, a display 207 is configured to display torque readings such that processor 205 can communicate torque data to a pilot of rotorcraft 101. More specifically, display 207 can provide a visual indication of real-time torque values, as well as past torque values, experienced in main rotor mast 117 and/or tail rotor drive shaft 119. Display 207 can also display a variety of data to a user, such as the component usage determined by the processes and methods disclosed herein. HUMS 209 can be in communication with any variety of sensors and processors necessary to perform the methods and processes disclosed herein. It should be appreciated that even though processor 205 is illustrated as a separate component as HUMS 209, it should be appreciated that processor 205 can be integrated into HUMS 209. Further HUMS 209 can be integrated with other aircraft systems, such as integrated avionics systems or flight control systems, to name a few examples.

Figure 17:
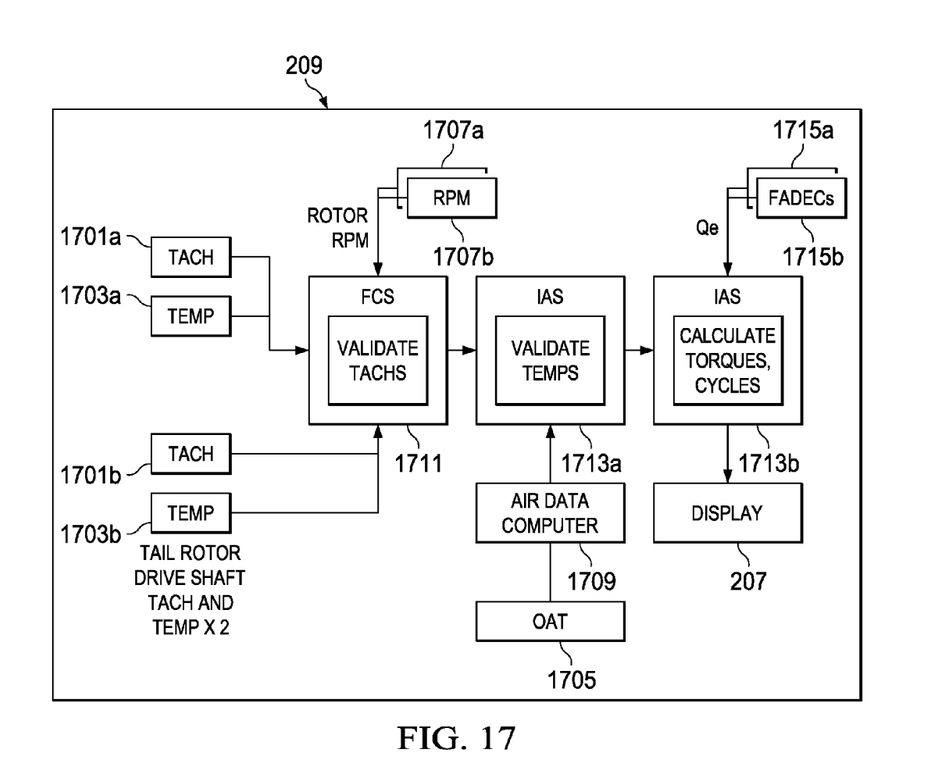
FIG. 17 is a schematic view of an example aircraft architecture, according to one example embodiment.

Briefly referring to FIG. 17, one example aircraft architecture to which HUMS 209 can be associated is schematically illustrated. It should be appreciated that HUMS 209 can incorporate or be in communication with any of the systems and sensors illustrated in FIG. 17. Sensors can include tail rotor tachometers 1701a and 1701b. tail rotor temperature sensors 1703a and 1703b, outside air temperature sensor 1705, and main rotor speed sensors 1707a and 1707b, for example. Processing systems can include an air data computer 1709, a flight control system (FCS) 1711, integrated avionics systems (IAS's) 1713a and 1713b, and full authority digital engine control units (FADEC's) 1715a and 1715b. FCS 1711 can be configured to validate tail rotor and main rotor speed measurements. IAS 1713a can be configured to validate temperatures. IAS 1713b can be configured with processing capabilities for calculating torque and low cycle torque events, for example. FIG. 17 is merely illustrative of one example architecture of a HUMS 209 that can be used to perform the processes and methods discloses herein.

Figure 3:
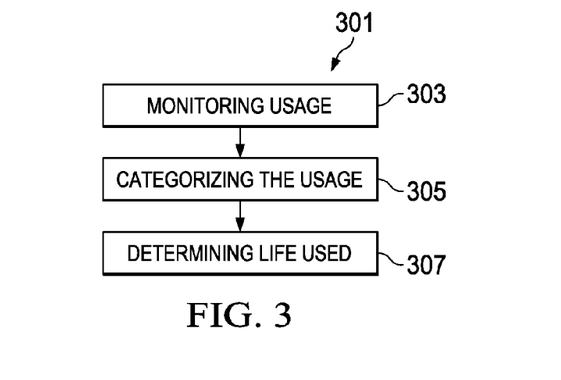
FIG. 3 is a schematic view of a method, according to one example embodiment.

Referring now also to FIG. 3, a method 301 of analyzing torque measurements and applying usage credits and debits to rotorcraft components is schematically illustrated. Method 301 can include a step 303 of monitoring usage, a step 305 of categorizing the usage, and a step 307 of determining life used. Each of these steps are described in further detail herein.

Step 303 includes monitoring torque during operation of a rotorcraft, such as rotorcraft 101. In one embodiment, the torque is main rotor torque, such as torque in main rotor mast 117. In another embodiment, the torque is tail rotor torque, such as torque in tail rotor drive shaft 119. In another embodiment, step 303 can include monitoring torque in both main rotor mast 117 and tail rotor drive shaft 119. Step 303 can include directly measuring the torque, or analytically deriving the torque, or any combination thereof. In the illustrated embodiment, the torque that is monitored in step 303 is low cycle torque in that the low frequency changes in torque are monitored rather than the high frequency changes in torque that can occur within a single rotation of the rotor system. It should be appreciated that both high cycle torque and low cycle torque can be measured, but step 303 preferably only includes the monitoring the low cycle torque events. In other words, the torque usage can be tracked so that the low cycle torque events can be identified. Exemplary low cycle torque events can include: a take-off a landing, an external load lift, to name a few examples. For purposes of the present disclosure, the low cycle torque events can also be referred to as torque excursions. For example, a torque excursion can be indicative of a low cycle torque event. The monitoring of the torque usage includes identifying the torque excursions (i.e. low cycle torque events) from the torque usage data. One unique feature of the present disclosure is the correlation of the torque excursions with the low cycle events. Monitoring torque usage and correlating with aircraft usage provides the certain benefits, as further described herein.

Figure 4:
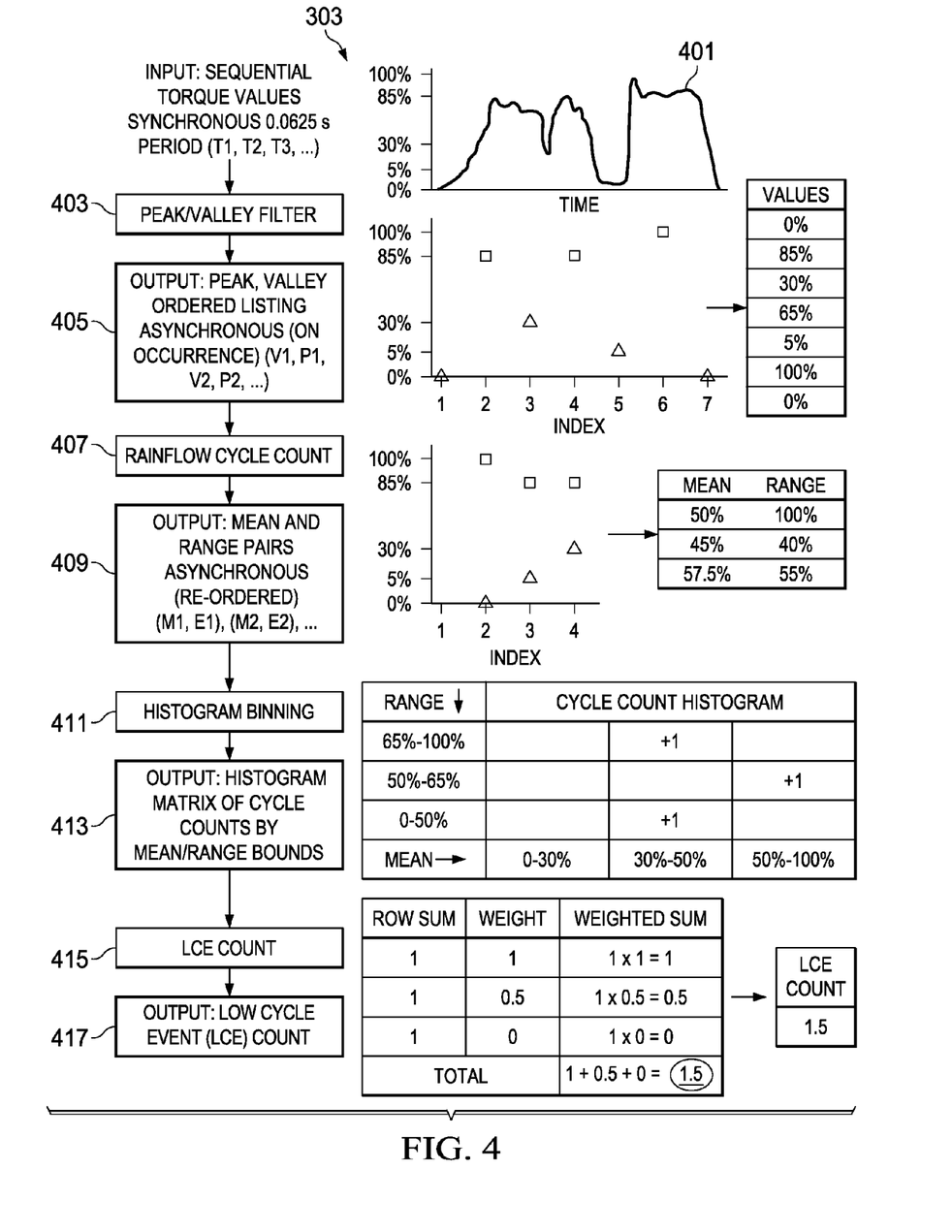
FIG. 4 is a schematic view of a method, according to one example embodiment.
Figure 5:
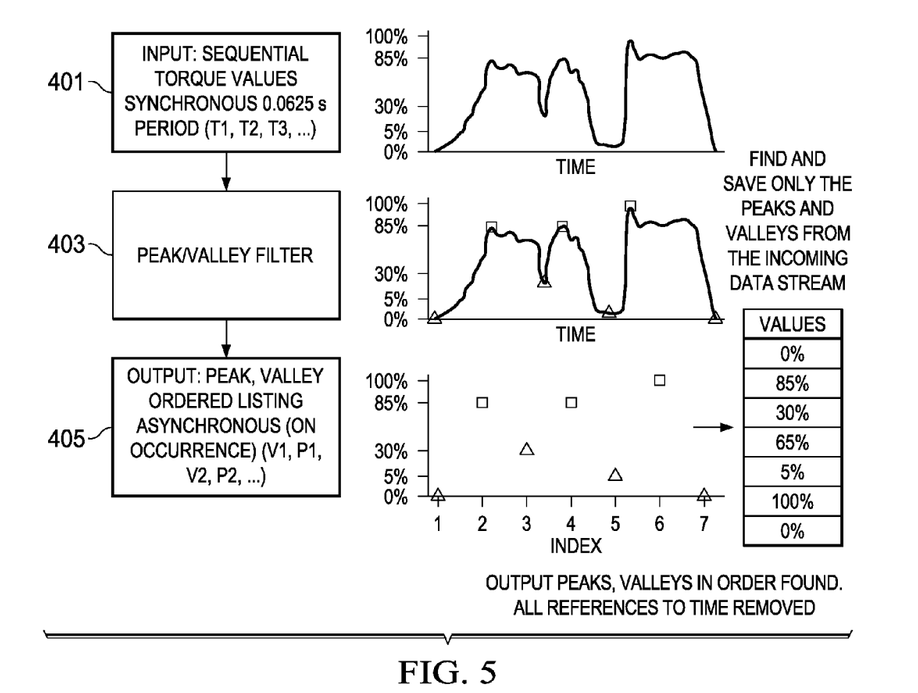
FIG. 5 is a schematic view of a method, according to one example embodiment.
Figure 6:
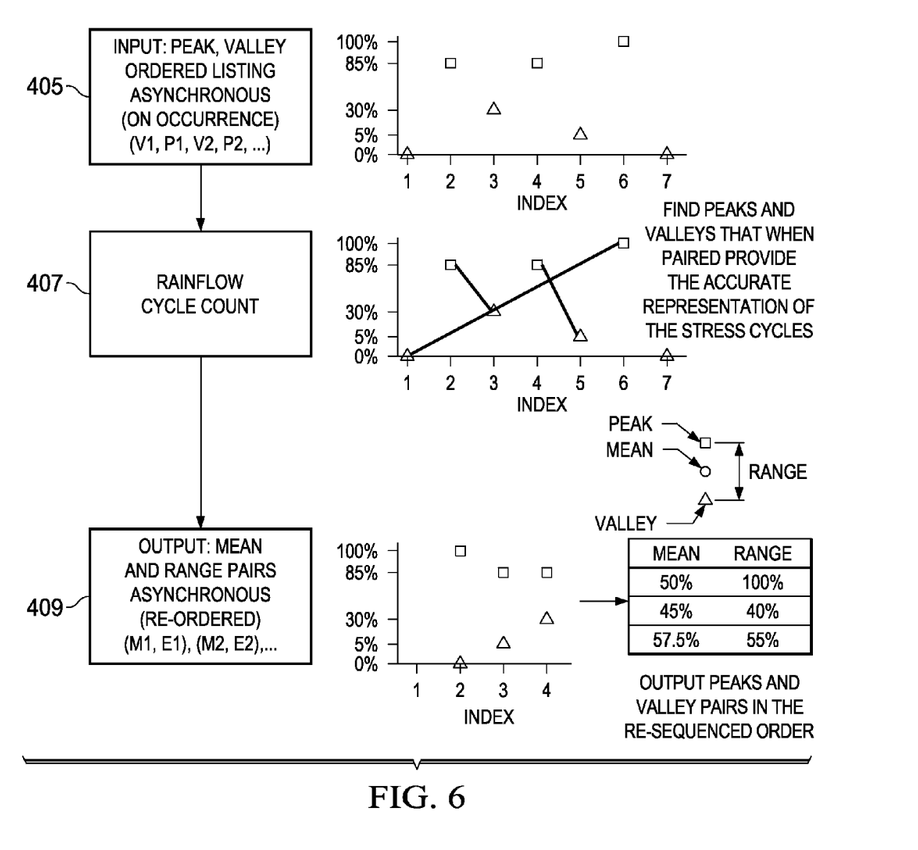
FIG. 6 is a schematic view of a method, according to one example embodiment.

Referring now also to FIG. 4, an implementation specific example of the step 303 of monitoring usage is illustrated. Step 303 can include calculating the torque usage data over a period of time, as illustrated by a graph 401. Next, a peak/valley filter 403 can be applied to the torque usage data. Referring also to FIG. 5, application of the peak/valley filter 403 is additionally described and illustrated in further detail. The peak/valley filter 403 processing identifies each peak and valley as a point, and then compares the neighboring points to verify that they qualify as a desired peak or valley (local maxima or local minima). If the difference between adjacent peaks and valleys is above a noise rejection threshold, then the values are saved in an output list 405. In one embodiment, the output list 405 is void of references to time. The output list 405 can be input into a rainflow cycle count 407. Referring also to FIG. 6, application of the rainflow cycle count 407 is additionally described and illustrated in further detail. Application of the rainflow cycle count 407 can include accounting for stress cycles in fatigue analysis so as to ensure the largest torque excursion is always identified, regardless of the order in which the peaks and valleys occur. Therefore, the rainflow cycle count 407 produces an output list 409 of paired peaks and valleys which are not necessarily in the order in which they occurred.

Figure 7:
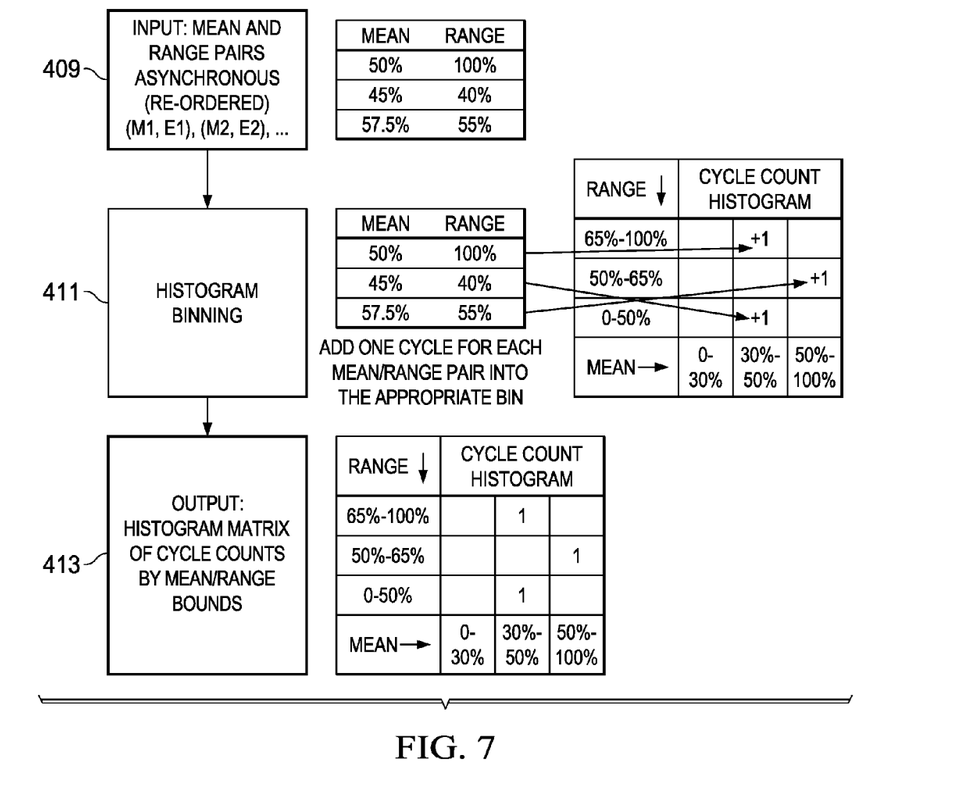
FIG. 7 is a schematic view of a method, according to one example embodiment.

Next, a histogram binning step 411 can be applied to the output list 409. Referring also to FIG. 7, application of the histogram binning step 411 is additionally described and illustrated in further detail. Application of the histogram binning step 411 can include placing each mean and range pair from output list 409 into a bin so that one cycle count is added to the appropriate bin based on their upper and lower bounds. In the illustrated example shown in FIG. 7, the three pairs are each categorized in a bin that has a unique range and mean range. The resulting bin count output 413 can be sent to a low cycle event count step 415.

Figure 8:
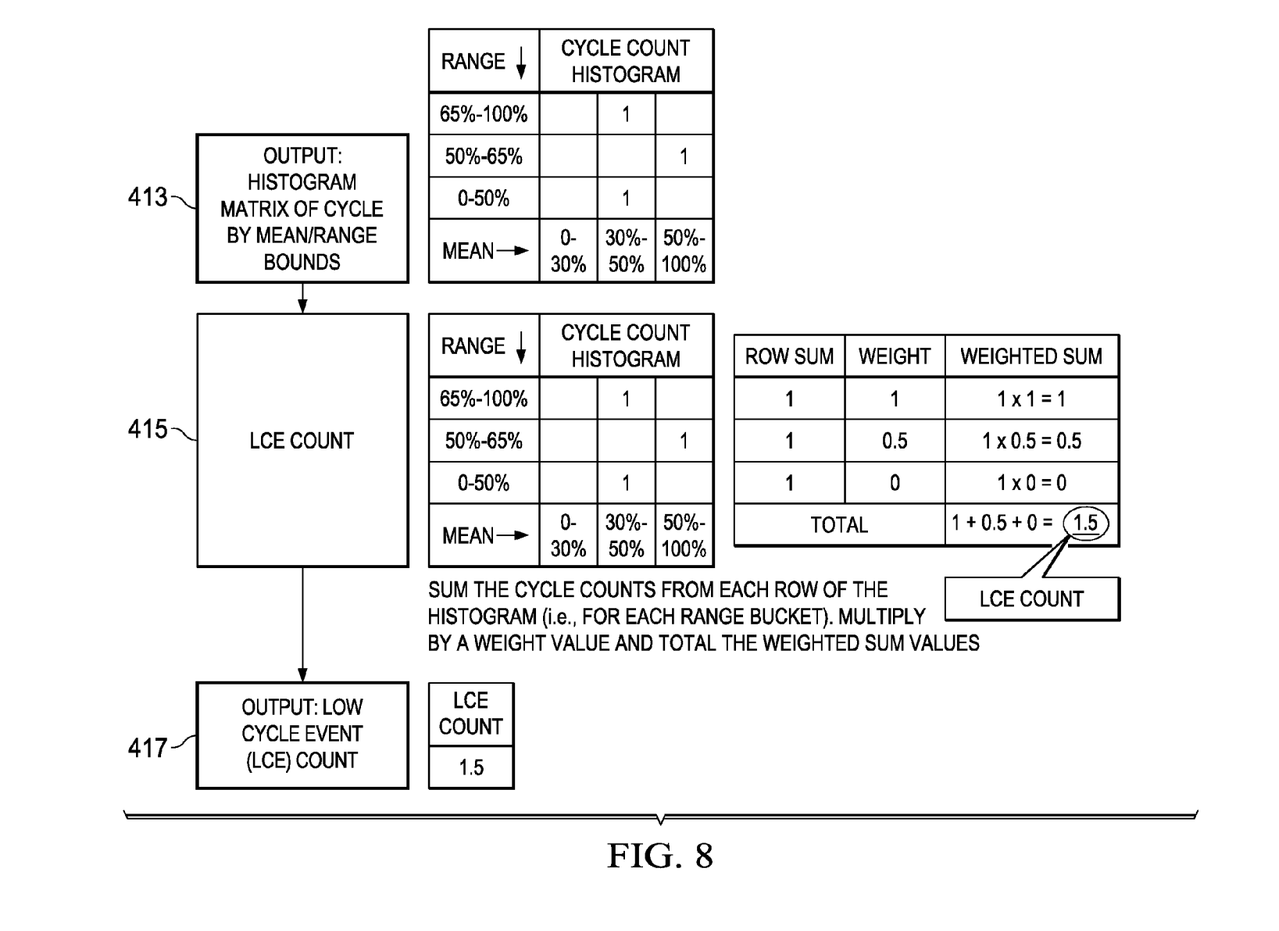
FIG. 8 is a schematic view of a method, according to one example embodiment.

Referring also to FIG. 8, the low cycle event (LCE) count step 415 can include calculating a row sum for each range bin. This sum is then multiplied by a weight value to generate a weighted sum. The weighted sums are totaled to generate a total LCE count value output 417. It should be appreciated that weighting factors can be applied to LCE counts in each cell of the histogram (an intersection of the range and mean bins) and then totaled to calculate a weighted sum.

Referring still to FIG. 3, method 301 further includes the step 305 of categorizing the usage. Step 305 can include categorizing the low cycle events (LCE's) per flight hour over a designated period of time, then assigning to a usage category based on value. Two exemplary usage categories are 1) long haul and 2) short haul. It should be appreciated that the exact type and number of usage categories is implementation specific; however, the implementation of a long haul category and a short haul category provide unique advantages, as described further herein. For illustration purposes, long haul is defined as less than or equal to ten LCE's per hour, whereas short haul is defined as greater than ten LCE's per hour. It should be appreciated that the long haul and short haul categories can be defined to any implementation specific value categorization.

Figure 9:
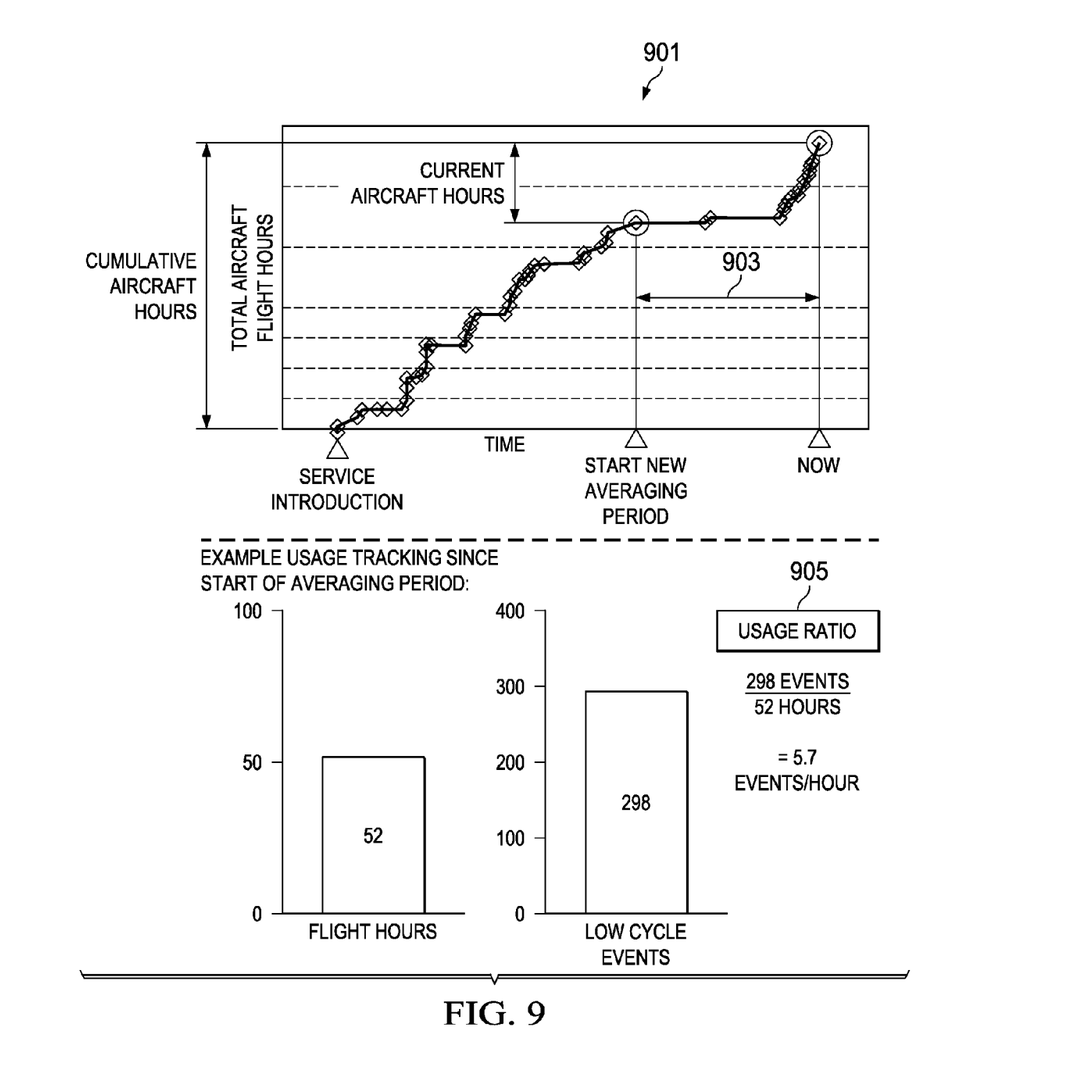
FIG. 9 is a schematic view of a method, according to one example embodiment.

Referring also to FIG. 9, step 305 is described and illustrated in further detail. FIG. 9 illustrates an example of the usage categorization in step 305. It should be appreciated that method 301 is a cumulative process, as such; graph 901 includes a historical portion as well as a new or current averaging period 903. The current averaging period 903 can span between a start time and an end time. It should be appreciated that there can be many averaging periods 903 over the life of the aircraft. During the averaging period 903, flight hours and LCE's are counted, as depicted in FIG. 9. At the end of the averaging period 903, a usage ratio 905 is calculated and the usage ratio 905 is compared to the predefined long haul and short haul thresholds. Depending on whether the ratio is above or below the threshold, these flight hours in the averaging period 903 are assigned to either the long haul category or the short haul category.

Figure 10:
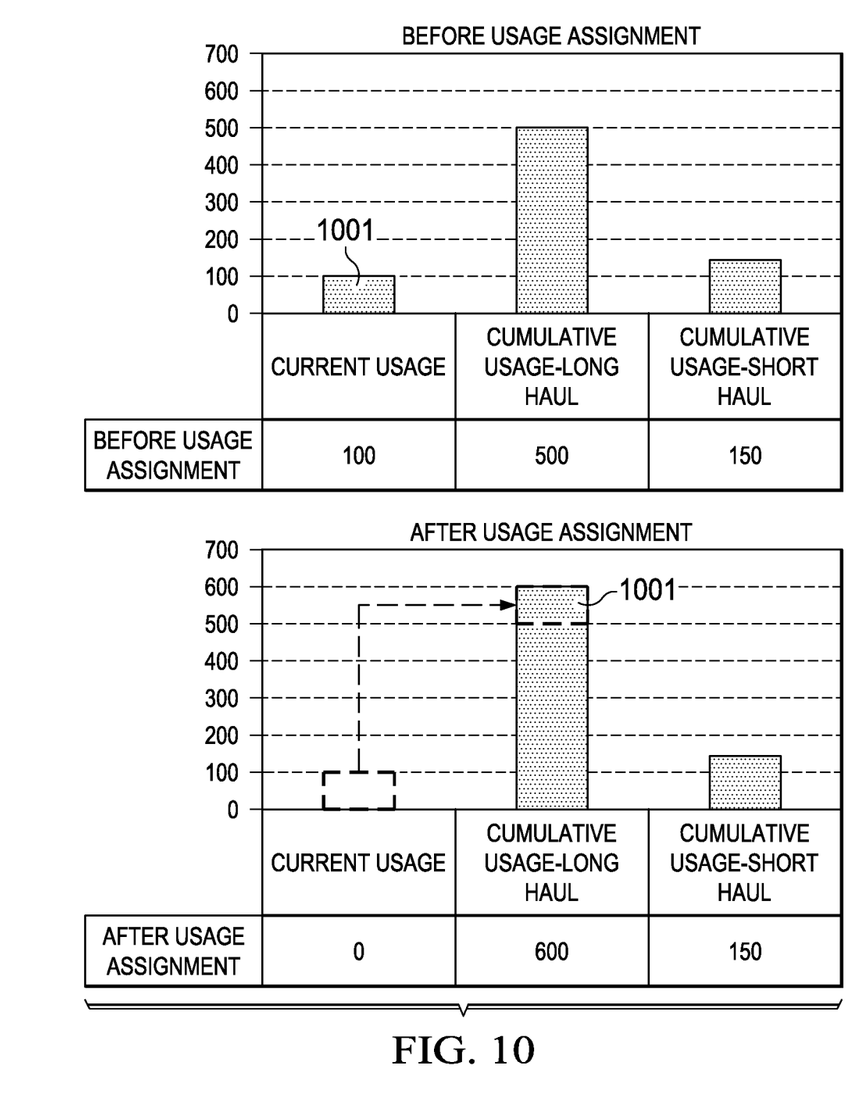
FIG. 10 is a schematic view of a method, according to one example embodiment.

Referring now also to FIG. 10, an assignment of the current usage 1001 in the averaging period 903 to the long haul hours cumulative usage log is illustrated. With regard to the example, the usage ratio is 5.7 LCE's per hour, which falls into the long haul category. This categorization of the flight time in the averaging period 903 can be displayed to the pilot on a display. In one embodiment, the averaging period 903 ends when a user accesses the usage log on the display.

Referring still to FIG. 3, method 301 further includes the step 307 of determining life used. The step 307 can include calculating a life used that is adjusted based upon the short haul hours receiving a penalty since short haul aircraft operation can typically cause the aircraft components to endure a higher number of fatigue cycles per hour as compared to long haul. As such, step 307 calculates life used based upon equivalent flight hours rather than simply total flight hours. Referring also to FIGS. 11-16, embodiments of step 307 are described and illustrated in further detail.

Figure 11:
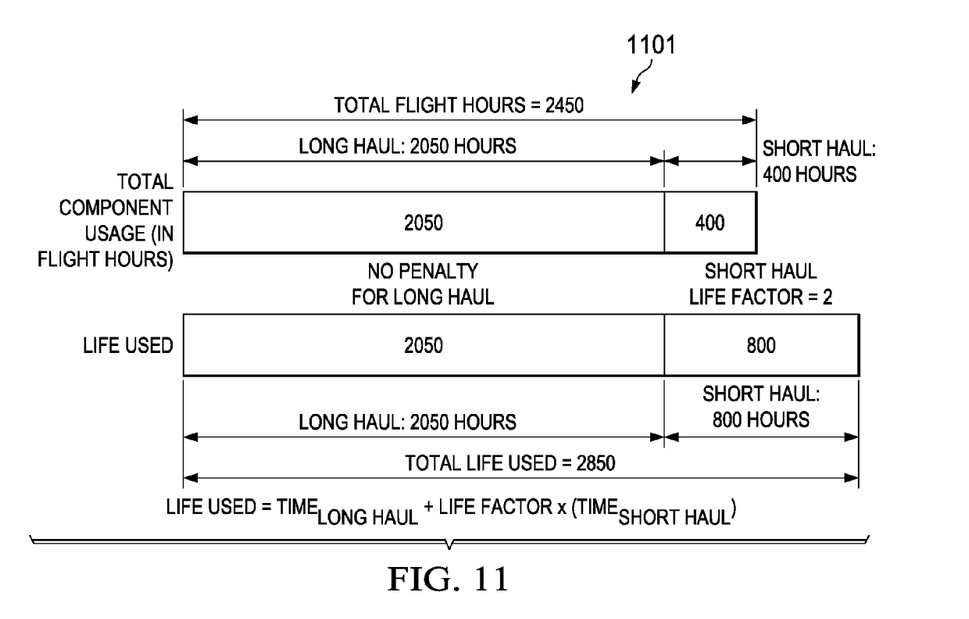
FIG. 11 is a schematic view of a method, according to one example embodiment.

FIG. 11 depicts an illustrative calculation of life used according to one example embodiment. In the illustrated embodiment, a component on rotorcraft 101 is analyzed using a life equation 1101. It should be appreciated that the component can be any component on the rotorcraft 101. For illustrative purposes, the component has a life of 5000 hours under long haul type flight conditions. The component is assigned a life factor for short haul type flight conditions. In the particular example, the component is given a life factor of 2.0 for short haul conditions. In order to calculate life used, the flight time spent in each category is multiplied by the appropriate life factor. It should be appreciated that certain rotorcraft components may have a life factor multiplier for long haul flight conditions. For example, a pitch link bearing may wear or fatigue at a faster rate in long haul flight conditions as compared to short haul conditions. Further to the example illustrated in FIG. 11, the total flight hours of the components is 2450 hours, of which 2050 hours were spent in long haul conditions and 400 hours were spent in short haul conditions. Since the component is classified with a short haul life factor of 2.0, the 400 hours spent in short haul conditions are calculated at 800 hours when calculating life used. FIG. 11 is an example of how more severe operation (short haul) can cause extra life used to be debited from the life of the component.

Figure 12:
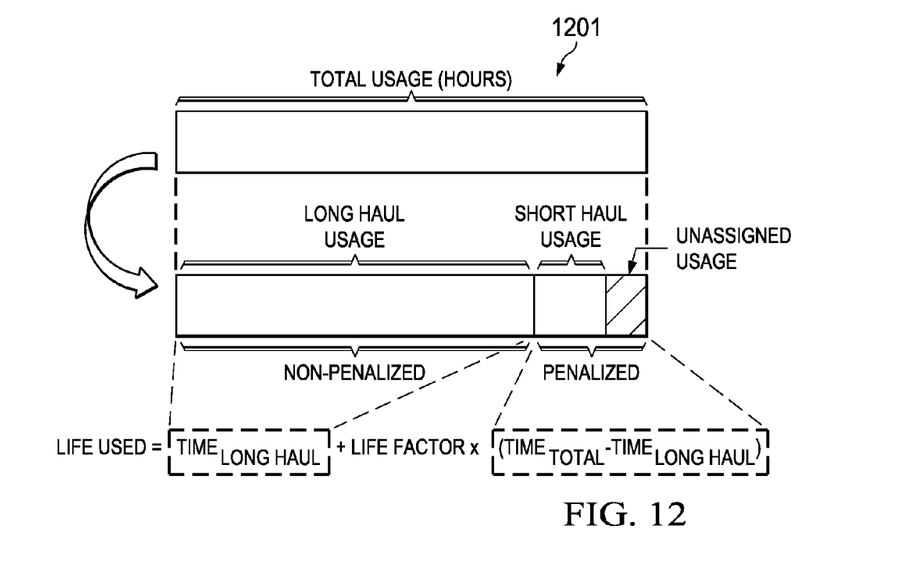
FIG. 12 is a schematic view of a method, according to one example embodiment.

Method 301 is configured such that if any component in the monitoring system fails, such a torque sensor or computer processor, the resulting, flight time that is unassigned usage is automatically given a usage category (long haul or short haul) that is the worst case usage category for the particular component. Further, invalid usage values can cause the system to stop accumulating usage. In one embodiment, the method 301 is configured to simplify the analysis so as to only use total usage and long haul usage when calculating life usage. The life used equation for such a scenario is illustrated in FIG. 12 as life used equation 1201. The simplification of the life usage calculation prevents the need for all three values (long haul usage, short haul usage, and unassigned usage) in order to calculate life used.

Figure 13:
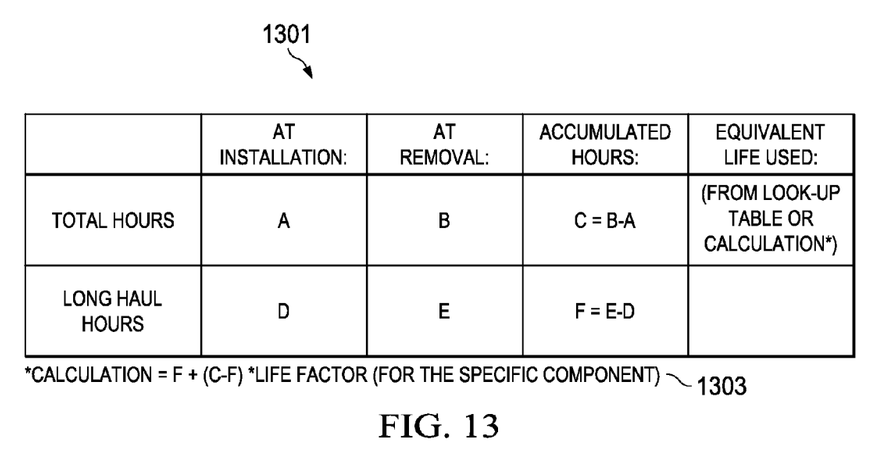
FIG. 13 is a schematic view of a method, according to one example embodiment.
Figure 14:
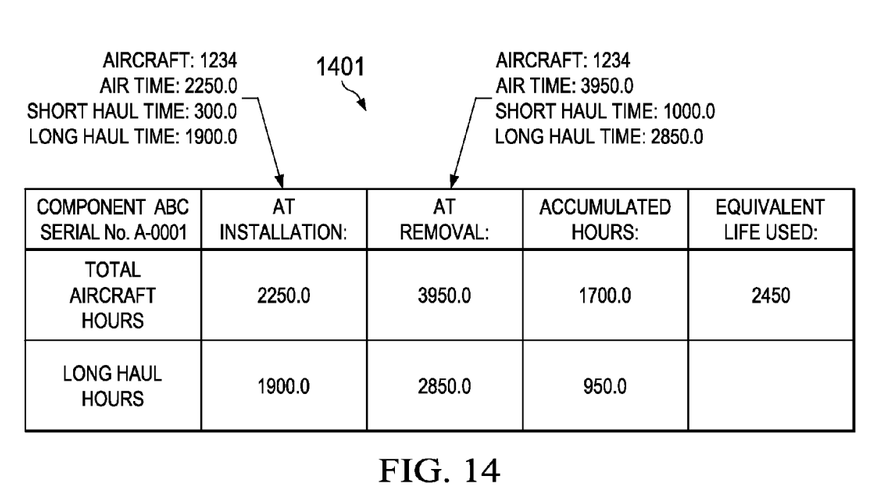
FIG. 14 is a schematic view of a method, according to one example embodiment.

Referring now also to FIG. 13, step 307 of method 301 can include the tracking of life used on the component level. For example, a chart 1301 is representative of a tracking process for a component that is installed on an aircraft at a point in time. The equation 1303 can be used to calculate life used for a component allowing the component be installed on different aircraft without losing the valuable life used data. Referring also to FIG. 14, a chart 1401 illustrates an example implementation of the life used equation 1303 from FIG. 13. In the example, a life factor of two is used. Thus applying the equivalent life used equation shown in FIG. 13, yields: 2450=950+(1700−950)*2.

Figure 15:
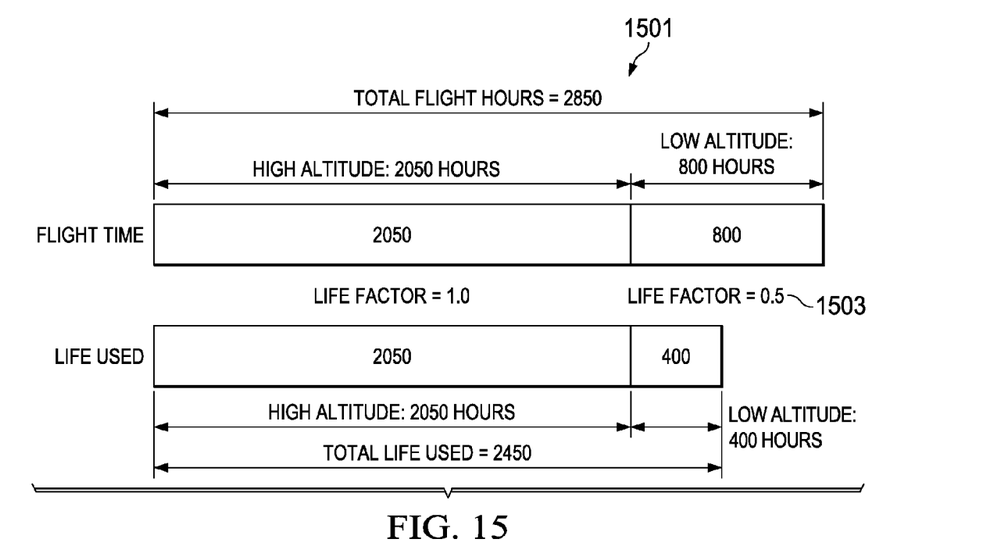
FIG. 15 is a schematic view of a method, according to one example embodiment.

Referring now also to FIG. 15, a schematic 1501 is an illustration of how step 307 of method 301 can include crediting life usage instead of debiting life usage. The primary difference between crediting life usage instead of debiting life usage is the life factor 1503 has a value less than one. Certain components may endure a reduced amount of loading at certain flight regimes. In such a scenario, the specific component can be assigned a life factor value less than one, which can result in a life used value to be less than the actual flight time endured by the component. An example calculation is illustrated in schematic 1501 of FIG. 15.

In one embodiment, method 301 is performed on-board the aircraft. In another embodiment, step 307 of method 301 is performed off-board the aircraft. In such an embodiment, data from the aircraft can be communicated to an off-board site.

It should be appreciated that aircraft components that can be monitored by the system and method of the present disclosure are implementation specific. A nonlimiting list of example aircraft components include: rotor system parts, drive system parts, transmission mounts, pylon attachments, engine mounts, airframe structure, tailboom structure, and landing gear, to name a few examples. Each component can have a different life factor value.

Figure 16A:
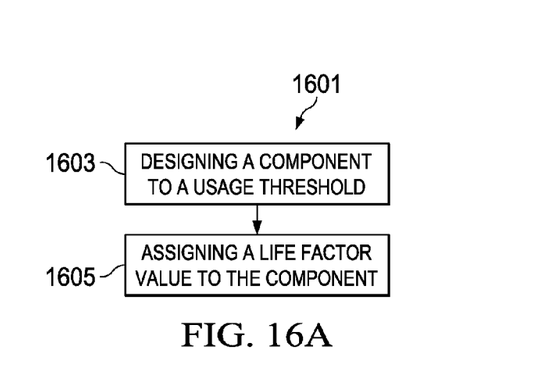
FIG. 16A is a schematic view of a method, according to one example embodiment.
Figure 16B:
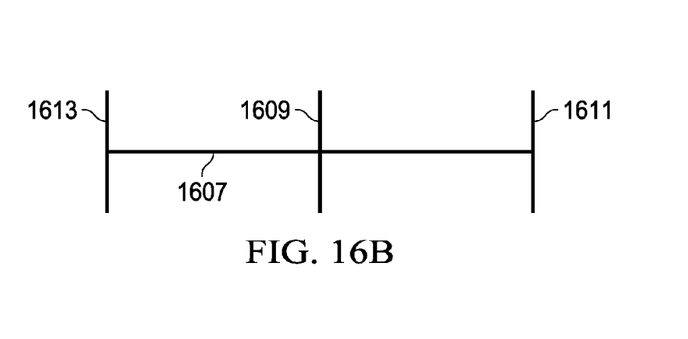
FIG. 16B is a schematic view of a design threshold, according to one example embodiment.

Referring now to FIG. 16A, a method 1601 of designing an aircraft component is schematically illustrated. A step 1603 includes designing an aircraft component to a usage threshold. Referring also to FIG. 16B, a usage threshold 1609 is schematically illustrated in conjunction with a usage range 1607. The usage range 1607 can extend from a most severe usage 1611 to a least severe usage 1613. As further stated herein, a most severe usage 1611 can be indicative of an aircraft operator that is particularly abusive to the rotorcraft by incurring a large volume of take-offs, landings, high gross weight loadings, etc. In contrast, a least severe usage 1613 can be indicative of an aircraft operator that performs mainly long haul flights with low gross weight, for example. Conventionally, rotorcraft components were designed to survive the most abusive user at the most severe usage 1611 end of the usage range 1607. As a result, the rotorcraft was heavier than necessary for the conservative operator that operates the rotorcraft at the least severe usage 1613 end of the usage range 1607. Furthermore, the conservative operator had to replace life limited components more frequently than necessary. However, since the systems and methods of the present disclosure provide an efficient and accurate process of accounting for a broad range of usage, the components can now be designed to a predefined usage threshold 1609, the usage threshold 1609 being a less severe usage than the most severe usage 1611. In other words, the component can be designed to a set of stress and fatigue allowables that are lower than otherwise. In practice, the component can be designed to have a more efficient weight.

Further regarding FIG. 16B, if a component has a calculated life of 10,000 hours when subjected to usage at predefined usage threshold 1609, and a calculated life of 5,000 hours when subjected to usage at the most severe usage 1611, then a ratio of 10,000 to 5,000 can produce a life factor of 2. Thus a life factor of 2 can be used when calculating equivalent life of the component when the component is subjected to usage at the most severe usage 1611 rather than the predefined usage threshold 1609.

Method 1601 also includes a step 1605 of assigning a life factor value to the component. The life factor is discussed further herein with regard to method 301. The life factor is assigned to each component in order to increase or decrease the usage rate based upon the type of flight category the usage time is assigned. For example, if the category is short haul, then the component can be given a life factor to increase or decrease the life used depending on whether the component accumulates fatigue damage faster or slower during short haul flight time. Similarly, if the category is long haul, then the component can be given a life factor to increase or decrease the life used depending on whether the component accumulates fatigue damage faster or slower during short haul flight time. FIG. 11 illustrates an example of how the life factor is employed when calculating life used.

Figure 18:
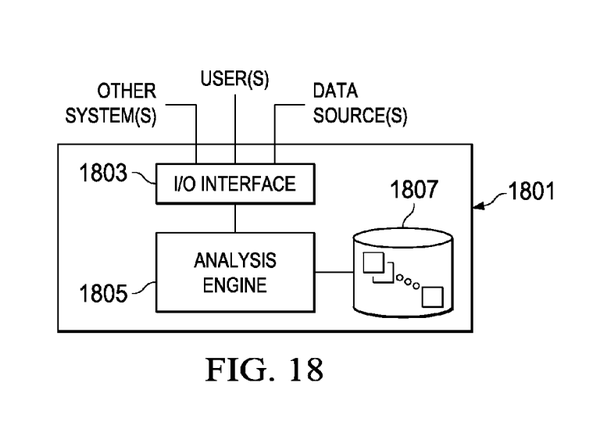
FIG. 18 is a schematic view of a computer system, according to one example embodiment.

Referring now also to FIG. 18, a computer system 1801 is schematically illustrated. Computer system 1801 can be configured for performing one or more functions with regard to the operation of system and method further disclosed herein. Further, any processing and analysis can be partly or fully performed by computer system 1801. Computer system 1801 can be partly or fully integrated with other aircraft computer systems.

The system 1801 can include an input/output (I/O) interface 1803, an analysis engine 1805, and a database 1807. Alternative embodiments can combine or distribute the input/output (I/O) interface 1803, analysis engine 1805, and database 1807, as desired. Embodiments of the system 1801 can include one or more computers that include one or more processors and memories configured for performing tasks described herein. This can include, for example, a computer having a central processing unit (CPU) and non-volatile memory that stores software instructions for instructing the CPU to perform at least some of the tasks described herein. This can also include, for example, two or more computers that are in communication via a computer network, where one or more of the computers include a CPU and non-volatile memory, and one or more of the computer's non-volatile memory stores software instructions for instructing any of the CPU(s) to perform any of the tasks described herein. Thus, while the exemplary embodiment is described in terms of a discrete machine, it should be appreciated that this description is non-limiting, and that the present description applies equally to numerous other arrangements involving one or more machines performing tasks distributed in any way among the one or more machines. It should also be appreciated that such machines need not be dedicated to performing tasks described herein, but instead can be multi-purpose machines, for example computer workstations, that are suitable for also performing other tasks.

The I/O interface 1803 can provide a communication link between external users, systems, and data sources and components of the system 1801. The I/O interface 1803 can be configured for allowing one or more users to input information to the system 1801 via any known input device. Examples can include a keyboard, mouse, touch screen, and/or any other desired input device. The I/O interface 1803 can be configured for allowing one or more users to receive information output from the system 1801 via any known output device. Examples can include a display monitor, a printer, cockpit display, and/or any other desired output device. The I/O interface 1803 can be configured for allowing other systems to communicate with the system 1801. For example, the I/O interface 1803 can allow one or more remote computer(s) to access information, input information, and/or remotely instruct the system 1801 to perform one or more of the tasks described herein. The I/O interface 1803 can be configured for allowing communication with one or more remote data sources. For example, the I/O interface 1803 can allow one or more remote data source(s) to access information, input information, and/or remotely instruct the system 1801 to perform one or more of the tasks described herein.

The database 1807 provides persistent data storage for system 1801. While the term "database" is primarily used, a memory or other suitable data storage arrangement may provide the functionality of the database 1807. In alternative embodiments, the database 1807 can be integral to or separate from the system 1801 and can operate on one or more computers. The database 1807 preferably provides non-volatile data storage for any information suitable to support the operation of the system and methods herein, including various types of data discussed further herein. The analysis engine 1805 can include various combinations of one or more processors, memories, and software components.

The particular embodiments disclosed herein are illustrative only, as the system and method may be modified and practiced in different but equivalent manners apparent to those skilled in the art having the benefit of the teachings herein. Modifications, additions, or omissions may be made to the system described herein without departing from the scope of the invention. The components of the system may be integrated or separated. Moreover, the operations of the system may be performed by more, fewer, or other components.

Furthermore, no limitations are intended to the details of construction or design herein shown, other than as described in the claims below. It is therefore evident that the particular embodiments disclosed above may be altered or modified and all such variations are considered within the scope and spirit of the disclosure.

To aid the Patent Office, and any readers of any patent issued on this application in interpreting the claims appended hereto, applicants wish to note that they do not intend any of the appended claims to invoke paragraph 6 of 35 U.S.C. § 112 as it exists on the date of filing hereof unless the words "means for" or "step for" are explicitly used in the particular claim.

The invention claimed is:

1. A method of monitoring usage of a component of an aircraft, the method comprising:
    monitoring a usage of the component by using a torque measurement system to calculate torque events over a time period;
    categorizing the usage of the component by assigning a usage value based upon whether a number of torque events in the time period is above or below a threshold; and
    determining a life used of the component;
    wherein the categorizing comprises counting flight hours and low cycle events that occur within an averaging period that spans between a start time and an end time and calculating a usage ratio for the averaging period; and
    wherein the end time is when a user accesses a usage log on a display.

2. The method according to claim 1, wherein the torque events are obtained by measuring torque in a main rotor mast.

3. The method according to claim 1, wherein the torque events are obtained by measuring torque in a tail rotor drive shaft.

4. The method according to claim 1, wherein the step of monitoring the usage of the component by using a torque measurement system to calculate torque events in the time period includes utilizing a peak/valley filter to identify the torque events.

5. The method according to claim 1, wherein the step of monitoring the usage of the component by using a torque measurement system to calculate torque events in the time period includes utilizing a peak/valley filter to associate a peak point with each peak and associate a valley point with each valley.

6. The method according to claim 5, wherein the step of monitoring the usage of the component by using the torque measurement system to calculate torque events in the time period includes applying a rainflow cycle count to pair together the peak point with the valley point.

7. The method according to claim 1, wherein the step of monitoring the usage of the component by using the torque measurement system to calculate torque events in the time period includes binning the torque events such that a single peak point and a single valley point are paired together to form the torque event.

8. The method according to claim 1, wherein the step of monitoring the usage of the component by using the torque measurement system to calculate torque events in the time period includes applying a weighted value to each torque event, the weighted value being indicative of a severity of the torque event.

9. The method according to claim 1, wherein the step of monitoring the usage of the component by using the torque measurement system to calculate torque events in the time period includes summing the torque events.

10. The method according to claim 1, wherein the step of categorizing the usage of the component by assigning the usage value based upon whether the number of torque events in the period of time is above or below the threshold further includes assigning the usage to a short haul category if the number of torque events in the period of time is above the threshold.

11. The method according to claim 1, wherein the step of categorizing the usage of the component by assigning the usage value based upon whether the number of torque events in the time period is above or below the threshold further includes assigning the usage to a long haul category if the number of torque events in the period of time is below the threshold.

12. The method according to claim 1, wherein the step of determining the life used of the component includes adjusting a measured flight time by multiplying the measured flight time by a factor that is dependent upon the usage value.

13. The method according to claim 12, wherein the factor causes an increase in the life used of the component when the usage is more severe than a nominal usage.

14. The method according to claim 12, wherein the factor causes a decrease in the life used of the component when the usage is less severe than a nominal usage.

15. The method according to claim 1, wherein the aircraft is a rotorcraft.

16. The method according to claim 15, wherein the rotorcraft is a helicopter.

17. A system for monitoring a usage of a component of an aircraft, the system comprising:
    a torque monitoring system configured to measure torque events over a time period; and
    a computer processor operable to categorize the usage of the component by assigning a usage value by calculating a usage ratio of the torque events to the time period and comparing the ratio to a threshold, the computer processor further operable to determine a life used of the component by adjusting a measured flight time by multiplying the measured flight time by a factor that is dependent upon the usage value, wherein the categorizing comprises counting flight hours and low cycle events that occur within an averaging period that spans between a start time and an end time and calculating the usage ratio for the averaging period and wherein the end time is when a user accesses a usage log on a display.

18. The system according to claim 17, wherein the factor causes an increase in the life used of the component when a measured usage is more severe than a predetermined nominal usage, the measured usage being derived from the torque events over the time period.

19. The system according to claim 17, wherein the factor causes decrease in the life used of the component when a measured usage is less severe than a predetermined nominal usage, the measured usage being derived from the torque events over the time period.

* * * * *